(12) United States Patent
Chen et al.

(10) Patent No.: US 10,894,406 B2
(45) Date of Patent: Jan. 19, 2021

(54) THIN FILM STACKS

(71) Applicant: HEWLETT-PACKARD DEVELOPMENT COMPANY, L.P., Fort Collins, CO (US)

(72) Inventors: Zhizhang Chen, Corvallis, OR (US); Mohammed S Shaarawi, Corvallis, OR (US); Jeremy Sells, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/306,607

(22) PCT Filed: Sep. 26, 2016

(86) PCT No.: PCT/US2016/053697
§ 371 (c)(1),
(2) Date: Dec. 3, 2018

(87) PCT Pub. No.: WO2018/057028
PCT Pub. Date: Mar. 29, 2018

(65) Prior Publication Data
US 2019/0217613 A1    Jul. 18, 2019

(51) Int. Cl.
*B41J 2/14*    (2006.01)
*B41J 2/16*    (2006.01)
(Continued)

(52) U.S. Cl.
CPC ......... *B41J 2/14129* (2013.01); *B41J 2/1601* (2013.01); *B41J 2/1629* (2013.01);
(Continued)

(58) Field of Classification Search
CPC .... B41J 2/14129; B41J 2/1646; B41J 2/1642; B41J 2/1629; B41J 2/1601; B41J 2202/11; C23C 4/04; C23C 4/134; C23C 16/45536
See application file for complete search history.

(56) References Cited

U.S. PATENT DOCUMENTS 7,517,060 B2    4/2009    Hess et al.
8,567,909 B2    10/2013    Sieber
(Continued)

FOREIGN PATENT DOCUMENTS

CN    105163941    12/2015
CN    105939857    9/2016
(Continued)

OTHER PUBLICATIONS

IP.com search (Year: 2019).*
(Continued)

*Primary Examiner* — Lisa Solomon
(74) *Attorney, Agent, or Firm* — Thorpe North & Western LLP

(57) ABSTRACT

A thin film stack can include a metal substrate having a thickness of from 200 angstroms to 5000 angstroms and a passivation barrier disposed on the metal substrate at a thickness of from 600 angstroms to 1650 angstroms. The passivation barrier can include a dielectric layer and an atomic layer deposition (ALD) layer disposed on the dielectric layer. The dielectric layer can have a thickness of from 550 to 950 angstroms. The ALD layer can have a thickness from 50 to 700 angstroms.

20 Claims, 2 Drawing Sheets

(51) Int. Cl.
*C23C 4/134* (2016.01)
*C23C 4/04* (2006.01)
*C23C 16/455* (2006.01)

(52) U.S. Cl.
CPC ........... *B41J 2/1642* (2013.01); *B41J 2/1646* (2013.01); *C23C 4/04* (2013.01); *C23C 4/134* (2016.01); *C23C 16/45536* (2013.01); *B41J 2202/11* (2013.01)

(56) References Cited

U.S. PATENT DOCUMENTS

| | | | |
|---|---|---|---|
| 9,033,470 | B2 | 5/2015 | Bengali et al. |
| 9,259,932 | B2 | 2/2016 | White et al. |
| 2004/0070649 | A1 | 4/2004 | Hess et al. |
| 2012/0298622 | A1* | 11/2012 | White .................... B41J 2/1603 216/27 |

FOREIGN PATENT DOCUMENTS

| | | |
|---|---|---|
| WO | WO-2013036424 A1 | 3/2013 |
| WO | WO-2015005934 A1 | 1/2015 |
| WO | WO-2015065397 A1 | 5/2015 |
| WO | WO-2015116050 A1 | 8/2015 |
| WO | WO-2016122584 | 8/2016 |
| WO | WO-2016122584 A1 * | 8/2016 |

OTHER PUBLICATIONS

IP.com search (updated) (Year: 2020).*
Hsu, S-M,. et al, Enhancement of gate-bias and current stress stability of P-type SnO thin-film transistors with SiNx/HfO2 passivation layers, 2016.

* cited by examiner

THIN FILM STACKS

BACKGROUND

In a typical inkjet printing system, an inkjet printhead ejects fluid (e.g., ink) droplets through a plurality of nozzles toward a print medium, such as a paper or other substrate, to print an image onto the print medium. The nozzles are generally arranged in one or more arrays or patterns, such that properly sequenced ejection of ink from the nozzles causes characters or other images to be printed on the print medium as the printhead and the print medium are moved relative to one another.

Because the ejection process is repeated thousands of times per second during printing, collapsing vapor bubbles can contribute to an adverse effect of damaging a heating element used in the printing process. The repeated collapsing of the vapor bubbles leads to cavitation damage at the surface material that coats the heating element. Each of these collapse events can thus contribute to ablation of the coating material. Once ink penetrates the surface material coating, the heating element and contacts the hot, high voltage resistor surface and rapid corrosion and physical destruction of the resistor soon follows, rendering the heating element ineffective. There are also other examples of systems, outside of the inkjet arts, where structures may undergo contact with harsh environments. As such, research and development continues in the area of protective films used in various applications that can provide improved performance.

BRIEF DESCRIPTION OF THE DRAWINGS

Additional features and advantages of the present disclosure will be apparent from the detailed description which follows, taken in conjunction with the accompanying drawings, which together illustrate, by way of example, features of the present technology.

Reference will now be made to specific examples illustrated, and specific language will be used herein to describe the same. It will nevertheless be understood that no limitation of the scope of the present disclosure is thereby intended.

DETAILED DESCRIPTION

In thermal inkjet (TIJ) technology, the passivation layer of a TIJ printhead can be directly related to energy efficiency, functionality, reliability, and other properties of the printhead. Often the passivation layer can be deposited by plasma-enhanced chemical vapor deposition (PECVD). While PECVD can be a powerful deposition technique, it can also result in a number of defects and step coverage limitations that can render the film to be relatively thick in order to maintain chemical robustness. However, thicker passivation layers can cause the TIJ printhead to be less energy efficient.

The present disclosure is drawn to thin film stacks, methods of manufacturing thin film stacks, and thermal inkjet (TIJ) printhead stacks that can help overcome some of the challenges described above. It is noted that when discussing a thin film stack, a method of manufacturing a thin film stack, or a TIJ printhead stack, each of these discussions can be considered applicable to each of these examples, whether or not they are explicitly discussed in the context of that specific example. Thus, for example, in discussing a dielectric layer for a passivation barrier in the thin film stack, such a dielectric layer can also be used in a method of manufacturing a thin film stack or in a TIJ printhead stack, and vice versa.

As such, with the present discussion in mind, a thin film stack can include a metal substrate having a thickness of from 200 angstroms to 20,000 angstroms. A passivation barrier can be disposed on the metal substrate at a thickness of from 600 angstroms to 1650 angstroms. The passivation barrier can include a dielectric layer and an atomic layer deposition (ALD) layer disposed on the dielectric layer. The dielectric layer can have a thickness from 550 to 950 angstroms. The ALD layer can have a thickness from 50 to 700 angstroms.

Figure 1:
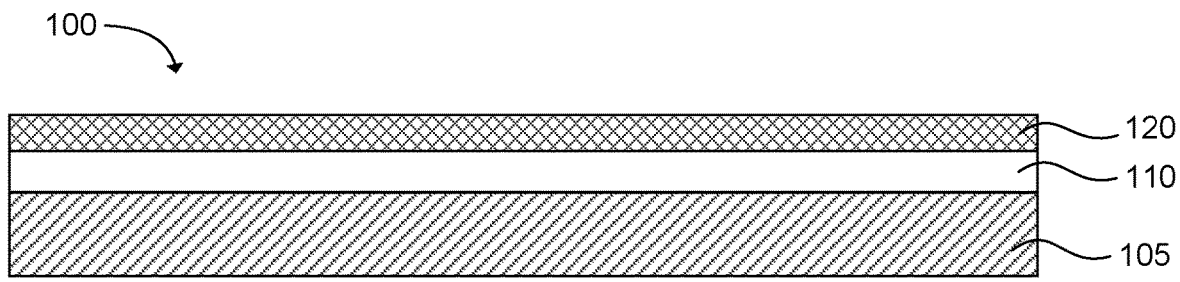
FIG. 1 is an example cross-section schematic view of a thin film stack in accordance with the present disclosure.

One example of a thin film stack is illustrated in FIG. 1. The thin film stack 100 can include a metal substrate 105. A dielectric layer 110 can be disposed on the metal substrate. An ALD layer can be disposed on the dielectric layer. The combined dielectric layer and ALD layer can form a passivation barrier on the metal substrate.

The metal substrate can be any suitable metal substrate. In some examples, the metal substrate can be made of a resistor material. In other specific examples, the substrate can include TaAl, WSiN, TaSiN, TaN, $Ta_2O_5$, the like, or a combination thereof.

In further detail, the metal substrate can have a thickness of from 200 angstroms to 20,000 angstrom, or the metal substrate can have a thickness of from 200 angstroms to 5000 angstroms. In another example, the metal substrate can have a thickness of from 200 angstroms to 3000 angstroms.

The passivation barrier can generally include two layers or layer types. While the two layers can be formed at different thicknesses relative to one another, the overall passivation barrier can typically have a thickness of from 600 angstroms to 1650 angstroms. In some additional examples, the passivation barrier can have a thickness of from 700 angstroms to 1000 or 1400 angstroms.

One of the layers of the passivation barrier can include a dielectric layer, which can be disposed on the metal substrate. In some examples, the dielectric layer can have a thickness of from 550 angstroms to 950 angstroms. In other examples, the dielectric layer can have a thickness of from 600 angstroms to 800 angstroms.

The dielectric layer can be of any suitable dielectric material. Non-limiting examples can include $SiO_2$, SiN, $SiO_xN_y$, $Al_2O_3$, $ZrO_2$, undoped silicate glass, the like, or a combination thereof. In one specific example, the dielectric layer can include SiN.

The ALD layer can be disposed on the dielectric layer. Generally, the ALD layer can have a thickness of from 50 angstroms to 700 angstroms. In some examples, the ALD layer can have a thickness of from 50 angstroms to 200 angstroms or 450 angstroms.

In further detail, in some examples, the ALD layer can be pinhole free. Whether the ALD layer is pinhole free can depend on the material or combination of materials forming the ALD layer. A pinhole freelayer can be verified by a number of methods. One such method can include forming a silicon nitride layer, or other suitable dielectric layer, and applying an ALD layer with a suitable pinhole free material, such as $HfO_2$, for example, to cover the silicon nitride layer.

A buffered oxide etch (BOE) solution can then be disposed on the ALD layer covering the silicon nitride layer. If the BOE solution etches the lower silicon nitride layer, the BOE solution was able to penetrate the ALD layer, indicating that the ALD layer is not pinhole free. If the BOE solution does not etch the lower silicon nitride layer, the BOE was not able to penetrate the ALD layer, which can indicate that the ALD layer is pinhole free.

The ALD layer can include a number of suitable materials. Non-limiting examples can include $HfO_2$, $ZrO_2$, $HfSi_xO_y$, $WSi_xO_y$, $Al_2O_3$, $Ta_2O_5$, SiN, the like, or a combination thereof. In one specific example, the ALD layer can include $HfO_2$. In another example, the ALD layer can include SiN. In another example, the ALD layer can be a metal oxide layer.

Turning now to a method of manufacturing a thin film stack, the method can include preparing a metal substrate having a thickness of from 200 angstroms to 20,000 angstroms. A passivation barrier can be deposited on the metal substrate at a thickness of from 600 angstroms to 1650 angstroms. Depositing the passivation barrier can include depositing a dielectric layer on the metal substrate at a thickness of 550 angstroms to 950 angstroms and depositing an ALD layer on the dielectric layer at a thickness of 50 angstroms to 700 angstroms.

The metal substrate can be prepared using any suitable deposition technique. Non-limiting examples can include chemical vapor deposition (CVD), physical vapor deposition (PVD), epitaxy, electrodeposition, sputtering, the like, or combinations thereof. Typically, the metal substrate can have a composition and thickness as described above.

With respect to the passivation barrier disposed on the metal substrate, this barrier can also have a composition and thickness as described above. Typically, the thickness of the passivation barrier does not exceed 1650 angstroms. Such thin passivation barriers can allow the device into which they are incorporated to be more energy efficient than an equivalent device incorporating a thicker passivation barrier, such as a 2000 to 3000 angstrom passivation barrier.

However, it can be challenging to prepare thin passivation barriers because of pinhole defects and step coverage limitations associated with some deposition methods. Thus, while the dielectric layer of the present passivation barrier can be deposited using any suitable deposition method, such as PECVD for example, the layer disposed on the dielectric layer can typically be deposited using atomic layer deposition or ALD. Atomic layer deposition can provide very thin layers that can, in some cases, be pinhole free, as described above. Because of the chemical robustness of the ALD layer, the dielectric layer can also be very thin. Thus, the thin ALD layer can typically allow the overall passivation barrier to be thin and energy efficient. Further still, the chemical robustness of the ALD layer can also decrease or eliminate the need for a protective layer to be disposed on the passivation barrier, making the overall thin film stack thinner still. As such, this passivation barrier can be desirable for a number of device applications.

In one specific example, the passivation barrier can be included in a thermal inkjet printhead stack. The thermal inkjet (TIJ) printhead stack can include an insulated substrate and a resistor disposed on the insulated substrate at a thickness of from 200 angstroms to 20,000 angstroms. A resistor passivation barrier can be disposed on the resistor at a thickness of from 600 angstroms to 1650 angstroms. The resistor passivation barrier can include a dielectric layer disposed on the resistor at a thickness of from 550 angstroms to 950 angstroms. The resistor passivation barrier can also include an ALD layer disposed on the dielectric layer at a thickness of from 50 angstroms to 700 angstroms. In some examples, the TIJ printhead stack does not include a protective layer disposed on the resistor passivation layer. In some examples, the thermal inkjet printhead stack can also include a pair of conductors electrically coupled to the resistor. A conductor passivation layer can also be disposed on the pair of conductors. In some examples, the conductor passivation layer can be the same as resistor passivation barrier.

Figure 2:
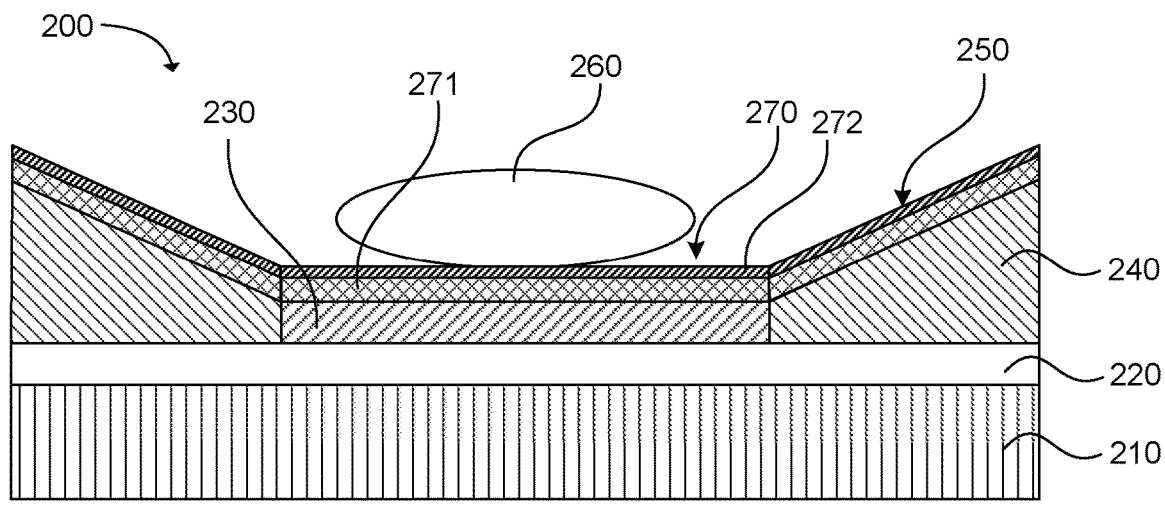
FIG. 2 is an example cross-sectional schematic view of a portion of a thermal inkjet printhead stack in accordance with the present disclosure.

An example thermal inkjet printhead stack is illustrated in FIG. 2 at 200. Specifically, a silicon wafer 210 is shown having an electrical insulating layer 220 applied thereto. To the insulating layer can be applied a resistor 230, which can be prepared using any known resistor material known in the thermal inkjet printing arts, such as TaAl, WSiN, TaSiN, TaN, or $Ta_2O_5$. A suitable average thickness for the resistor can be from 0.02 microns to 0.5 microns or from 0.02 microns to 2 microns, though thicknesses outside of this range can also be used. Furthermore, the resistor, as described, can be doped with any material suitable for achieving desired electrical properties, including, but not limited to, resistivity. In some examples, the resistor can have a bulk electrical resistivity of from 200 μΩ·cm to 200 Ω·cm, 200 μΩ·cm to 10,000 μΩ·cm, or from 200 μΩ·cm to 2000 μΩ·cm.

The resistor 230 can likewise be in electrical communication with a pair of conductors 240 positioned on either side of the resistor. These conductors can act as electrodes for the resistor. In this example, the conductors are also disposed on the insulating layer 220, though this arrangement is merely exemplary. The conductors can be of any material suitable for use as conductors, such as gold, aluminum, copper, the like, or an alloy thereof, such as an alloy of aluminum and copper, for example.

Furthermore, conductor passivation layers 250, which can also be insulating, can be disposed on the conductors to prevent contact between the ink 260 and the conductors 240. A suitable average thickness for the conductors can be from 0.1 micron to 2 microns, and a suitable average thickness for the conductor passivation layers can be from 0.02 micron to 1 micron, though thicknesses outside of this range can also be suitable. However, where the conductor passivation layer is the same as the resistor passivation barrier, the conductor passivation layer can have the same thicknesses described for the resistor passivation barrier.

Insulating materials that can be used for the electrical insulating layer 220, the conductor passivation layers 250, or any other insulating layer can be $SiO_2$, SiN, $Al_2O_3$, $HfO_2$, $ZrO_2$, $HfSi_xO_y$, $WSi_xO_y$, or undoped silicate glass, for example. The electrical insulating films or conductor passivation layers, for example, can be formed by thermal oxidation of the conductors or deposition of an electrically insulating thin film.

To the resistor 230, a resistor passivation barrier 270 can likewise be applied. As previously described, the resistor passivation barrier can include a dielectric layer 271 and an ALD layer 272 disposed on the dielectric layer. These layers can be prepared as described above. Also, it is noted that the resistor passivation barrier and the conductor passivation layers 250 can be integrated as a single layer, or may remain as separate, adjacent layers. Because the resistor passivation barrier is sufficiently chemically robust alone, the TIJ printhead stack can exclude a protective layer, which can typically be disposed on the passivation layer. It is also noted that many other types or positioning of layers can also be used as would be appreciated by one skilled in the art after considering the present disclosure.

It is noted that, as used in this specification and the appended claims, the singular forms "a," "an," and "the" include plural referents unless the context clearly dictates otherwise.

As used herein, "devoid of" refers to the absence of materials in quantities other than trace amounts, such as impurities.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 5 at % to about 90 at %" should be interpreted to include not only the explicitly recited values of about 5 at % to about 90 at %, but also include individual values and sub-ranges within the indicated range. Thus, included in this numerical range are individual values such as 6, 7.5, and 8 and sub-ranges such as from 5-75, from 7-80, and from 9-85, etc. This same principle applies to ranges reciting only one numerical value. Furthermore, such an interpretation should apply regardless of the breadth of the range or the characteristics being described.

The following example illustrates features of the disclosure that are presently known. Thus, this example should not be considered as a limitation of the present technology, but is merely in place to teach how to make compositions of the present disclosure. As such, a representative number of compositions and their methods of manufacture are disclosed herein.

Example

Turn on Energy Test for Passivation Barrier

Various thermal inkjet (TIJ) printhead stacks were prepared having identical structural configurations except that the passivation barrier was different for each of the printhead stacks. Specifically, Sample 1 (control sample) included a SiN layer coated with a SiC layer. Both layers were deposited using PECVD. In contrast, Samples 2-9 included a SiN dielectric layer coated with a $HfO_2$ layer. The SiN layer was deposited using PECVD and the $HfO_2$ layer was deposited using ALD. The thicknesses in angstroms for each of the layers included in the various passivation barriers are described more fully in Table 1. None of the printhead stacks included a cavitation layer deposited on the passivation barrier.

The total thickness of the passivation barrier for Sample 1 was about 2500 angstroms, which is not uncommon for passivation barriers in thermal inkjet printhead stacks. In contrast, Samples 2-9 had total thicknesses ranging from 700 to 1000 angstroms, less than half the thickness of the control sample.

TABLE 1

| Sample | SiN | SiC | $HfO_2$ | Total |
|---|---|---|---|---|
| 1 | 1670 | 830 | n/a | 2500 |
| 2 | 600 | n/a | 100 | 700 |
| 3 | 600 | n/a | 200 | 800 |
| 4 | 700 | n/a | 50 | 750 |
| 5 | 700 | n/a | 100 | 800 |
| 6 | 700 | n/a | 200 | 900 |
| 7 | 800 | n/a | 50 | 850 |
| 8 | 800 | n/a | 100 | 900 |
| 9 | 800 | n/a | 200 | 1000 |

Energy to each of the TIJ printhead stacks was ramped down until the printhead stopped printing at a steady drop weight. This drop off point was compared between the control sample (Sample 1) and each of the test samples (Samples 2-9). This is a measurement of the pulse duration required to fire a particular drop size. The longer the pulse duration required to print a particular drop weight, the greater the energy consumption. Table 2 illustrates the percent decrease in energy consumption for Samples 2-9 as compared to Sample 1.

TABLE 2

| Sample | % Decrease In Energy Consumption |
|---|---|
| 2 | 30% |
| 3 | 27% |
| 4 | 30% |
| 5 | 31% |
| 6 | 25% |
| 7 | 30% |
| 8 | 25% |
| 9 | 25% |

As depicted in Table 2, each of Samples 2-9 exhibited at least a 25% decrease in energy consumption to achieve a predetermined drop volume as compared to Sample 1. Further, some of the samples exhibited a 30% decrease in energy consumption, or more, as compared to Sample 1.

Figure 3:
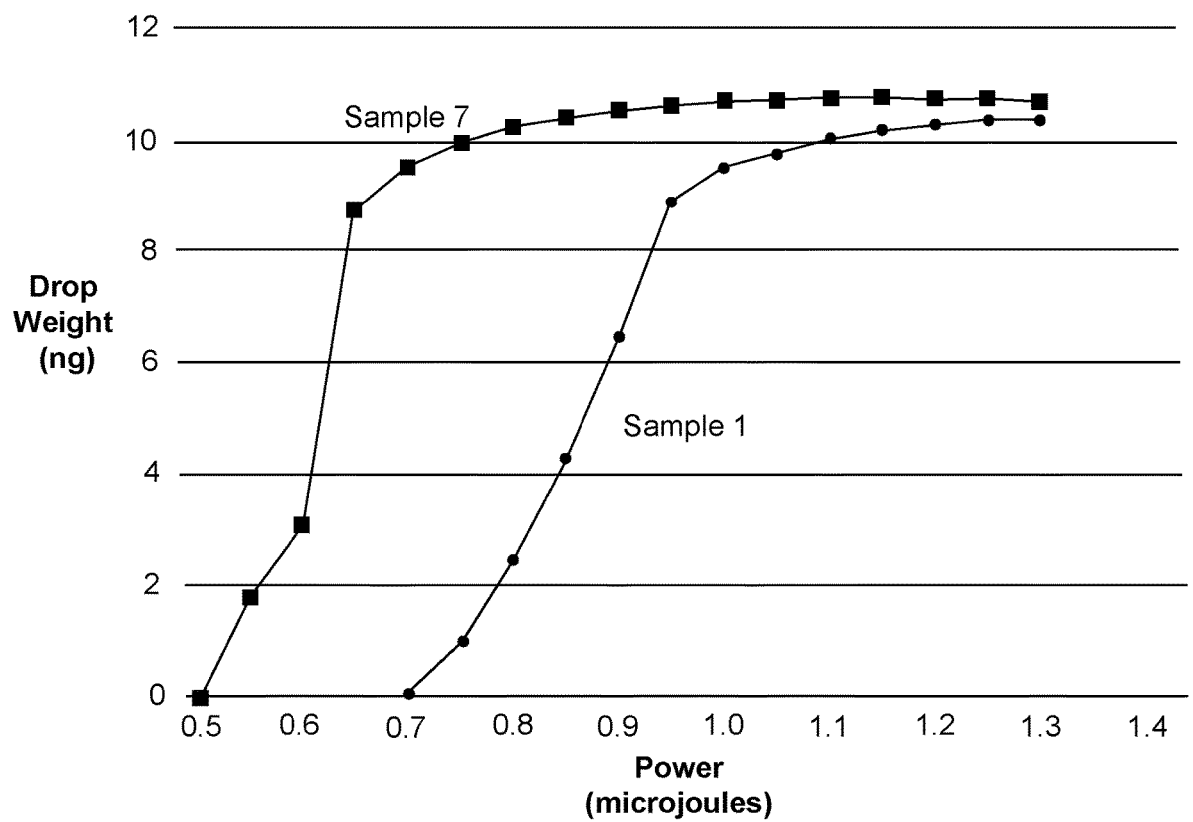
FIG. 3 is an example graph comparing power requirements for various ink drop volumes in two example thermal inkjet printheads.

FIG. 3 provides a comparative graphical illustration of the energy requirements to eject various drop volumes from Sample 1 as compared to Sample 7. The energy requirements for each drop volume was determined as described above. It is noted that Samples 2-9 all exhibited fairly similar turn on energy profiles to Sample 7. As such, only Sample 7 is illustrated for the sake of clarity. As can be seen in FIG. 3, Sample 7 did not require as many microjoules of energy as Sample 1 to eject equivalent drop volumes of ink. In fact, Sample 7 required less energy to eject a 10 ng ink droplet than Sample 1 required to eject a 2 ng ink droplet.

While the present technology has been described with reference to certain examples, those skilled in the art will appreciate that various modifications, changes, omissions, and substitutions can be made without departing from the spirit of the present technology. It is intended, therefore, that the present technology be limited only by the scope of the following claims.

What is claimed is:

1. A thermal inkjet printhead stack, comprising:
an insulated substrate;
a resistor disposed on the insulated substrate at a thickness of from 200 angstroms to 5000 angstroms, wherein the resistor has a bulk electrical resistivity of from 200 $\mu\Omega\cdot cm$ to 200 $\Omega\cdot cm$; and a resistor passivation barrier disposed on the resistor at a thickness of from 600 angstroms to 1400 angstroms, said resistor passivation barrier, comprising:
 a dielectric layer disposed on the resistor at a thickness of from 550 angstroms to 950 angstroms, and
 an ALD layer disposed on the dielectric layer at a thickness of from 50 angstroms to 700 angstroms,
wherein the thermal inkjet printhead stack does not include a protective layer disposed on the resistor passivation layer.

2. The thermal inkjet printhead stack of claim 1, further comprising a pair of conductors electrically coupled to the resistor.

3. The thermal inkjet printhead stack of claim 2, wherein the resistor passivation barrier is also disposed on the pair of conductors.

4. The thermal inkjet printhead stack of claim 1, wherein the ALD layer is pinhole free.

5. The thermal inkjet printhead stack of claim 1, wherein the resistor passivation barrier has a thickness from 700 angstroms to 1400 angstroms.

6. The thermal inkjet printhead stack of claim 1, wherein the dielectric layer has a thickness of from 600 to 800 angstroms.

7. The thermal inkjet printhead stack of claim 1, wherein the dielectric layer comprises $SiO_2$, SiN, $SiO_xN_y$, $Al_2O_3$, $ZrO_2$, undoped silicate glass, or a combination thereof.

8. The thermal inkjet printhead stack of claim 1, wherein the dielectric layer is deposited by plasma-enhanced chemical vapor deposition (PECVD).

9. The thermal inkjet printhead stack of claim 1, and the ALD layer has a thickness from 50 angstroms to 450 angstroms.

10. The thermal inkjet printhead stack of claim 1, wherein the ALD layer comprises $HfO_2$, $ZrO_2$, $HfSi_xO_y$, $WSi_xO_y$, $Al_2O_3$, $Ta_2O_5$, SiN, or a combination thereof.

11. A thermal inkjet printhead stack, comprising:
 an insulated substrate;
 a resistor disposed on the insulated substrate at a thickness of from 200 angstroms to 5000 angstroms; and
 a pair of conductors electrically coupled to the resistor; and
 a resistor passivation barrier disposed on the resistor at a thickness of from 600 angstroms to 1400 angstroms, said resistor passivation barrier, comprising:
  a dielectric layer disposed on the resistor at a thickness of from 550 angstroms to 950 angstroms, and
  an ALD layer disposed on the dielectric layer at a thickness of from 50 angstroms to 700 angstroms,
 wherein the thermal inkjet printhead stack does not include a protective layer disposed on the resistor passivation layer.

12. The thermal inkjet printhead stack of claim 11, wherein the resistor passivation barrier is also disposed on the pair of conductors.

13. The thermal inkjet printhead stack of claim 11, wherein the ALD layer is pinhole free.

14. The thermal inkjet printhead stack of claim 11, wherein the resistor passivation barrier has a thickness from 700 angstroms to 1400 angstroms.

15. The thermal inkjet printhead stack of claim 11, wherein the dielectric layer has a thickness of from 600 to 800 angstroms.

16. The thermal inkjet printhead stack of claim 11, wherein the dielectric layer comprises $SiO_2$, SiN, $SiO_xN_y$, $Al_2O_3$, $ZrO_2$, undoped silicate glass, or a combination thereof.

17. The thermal inkjet printhead stack of claim 11, wherein the dielectric layer is deposited by plasma-enhanced chemical vapor deposition (PECVD).

18. The thermal inkjet printhead stack of claim 11, and the ALD layer has a thickness from 50 angstroms to 450 angstroms.

19. The thermal inkjet printhead stack of claim 11, wherein the ALD layer comprises $HfO_2$, $ZrO_2$, $HfSi_xO_y$, $WSi_xO_y$, $Al_2O_3$, $Ta_2O_5$, SiN, or a combination thereof.

20. A method of manufacturing the thermal inkjet printhead stack of claim 1, comprising:
 depositing the resistor on the insulated substrate;
 depositing the resistor passivation barrier on the resistor, wherein depositing the resistor passivation barrier comprises:
  depositing the dielectric layer on the resistor, and
  depositing the ALD layer on the dielectric layer.

* * * * *